US009167663B2

(12) United States Patent
Kim et al.

(10) Patent No.: US 9,167,663 B2
(45) Date of Patent: Oct. 20, 2015

(54) DISPLAY APPARATUS AND METHOD OF REPAIRING THE SAME

(71) Applicant: SAMSUNG DISPLAY CO., LTD., Yongin, Gyeonggi-do (KR)

(72) Inventors: Na-Young Kim, Yongin (KR); Ki-Nyeng Kang, Yongin (KR); Keum-Nam Kim, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 310 days.

(21) Appl. No.: 13/798,694

(22) Filed: Mar. 13, 2013

(65) Prior Publication Data

US 2014/0117860 A1 May 1, 2014

(30) Foreign Application Priority Data

Oct. 26, 2012 (KR) .................. 10-2012-0119798

(51) Int. Cl.
*G09G 3/22* (2006.01)
*G09G 3/29* (2006.01)
*H05B 37/02* (2006.01)
*G02F 1/1362* (2006.01)
*H01J 9/50* (2006.01)
*H01L 27/32* (2006.01)

(52) U.S. Cl.
CPC .......... *H05B 37/02* (2013.01); *G02F 1/136259* (2013.01); *H01J 9/50* (2013.01); *H01L 27/3276* (2013.01); *G02F 2001/136263* (2013.01); *G02F 2201/508* (2013.01); *H01L 2251/568* (2013.01)

(58) Field of Classification Search
USPC .................................. 315/160–176
See application file for complete search history.

(56) References Cited

U.S. PATENT DOCUMENTS

| 8,227,977 | B2 | 7/2012 | Lhee et al. | |
|---|---|---|---|---|
| 2002/0053884 | A1* | 5/2002 | Kimura | 315/169.3 |
| 2006/0181221 | A1* | 8/2006 | Sato | 315/169.3 |
| 2006/0238134 | A1* | 10/2006 | Park et al. | 315/169.3 |
| 2007/0029941 | A1* | 2/2007 | Ito et al. | 315/169.3 |
| 2007/0273294 | A1* | 11/2007 | Nagayama | 315/169.3 |

(Continued)

FOREIGN PATENT DOCUMENTS

JP 11119250 A 4/1999
KR 10-2008-0041015 A 5/2008

(Continued)

OTHER PUBLICATIONS

Extended European Search Report issued on Feb. 21, 2014 by EPO in connection with European Patent Application No. 13182483.1, which corresponds to the present application.

*Primary Examiner* — Brandon S Cole

(74) *Attorney, Agent, or Firm* — Robert E. Bushnell, Esq.

(57) ABSTRACT

Provided is a display apparatus including a plurality of unit pixels, each including a plurality of sub-pixels; a first line branched in a first direction from a common line as many as the number of sub-pixels in each of the unit pixels so as to connect sub-pixels emitting light of the same color in neighboring unit pixels to each other; a second line extending in a second direction that crosses the first direction and connected to the sub-pixels; and a third line adjacent to the second line, extending in the second direction, and including a hole formed on a portion where the first line and the third line cross each other, and connected to the sub-pixels.

19 Claims, 7 Drawing Sheets

(56) References Cited

U.S. PATENT DOCUMENTS

2008/0218090 A1* 9/2008 Yoo et al. .................. 315/169.3
2009/0160744 A1* 6/2009 Kim et al. ........................ 345/84
2011/0273491 A1 11/2011 Iida et al.

FOREIGN PATENT DOCUMENTS

| KR | 10-2010-0021131 A | 2/2010 |
| KR | 10-2011-0112380 A | 10/2011 |
| KR | 10-2012-0011671 A | 2/2012 |

* cited by examiner

DISPLAY APPARATUS AND METHOD OF REPAIRING THE SAME

CLAIM OF PRIORITY

This application makes reference to, incorporates the same herein, and claims all benefits accruing under 35 U.S.C. §119 from an application for DISPLAY APPARATUS AND METHOD OF REPAIRING THE SAME earlier filed in the Korean Intellectual Property Office filed on 26 Oct. 2012 and there duly assigned Serial No. 10-2012-0119798.

BACKGROUND OF THE INVENTION

1. Field of the Invention

The present invention relates to a display apparatus including a wiring structure that is repairable and a method of repairing the display apparatus.

2. Description of the Related Art

Flat panel display apparatuses such as organic light emitting display apparatuses and liquid crystal display apparatuses have a plurality of pixels. Each of the pixels includes a pixel circuit unit including a thin film transistor (TFT) and a capacitor, and each pixel circuit unit is connected to wires.

As a resolution of such a flat panel display apparatus increases, the number of wires increases and an integration increases. Also, as the flat panel display apparatus becomes greater, a possibility of occurring defects such as shortage or opening between wires also increases. In particular, in order to form a flat panel display apparatus of a large size, the number of panels that may be formed on a mother substrate is reduced. Thus, when a mother substrate including a panel having a defect is discarded, production yield is largely affected. Therefore, a configuration and a method of repairing wires, which are suitable for flat panel display apparatus having high resolution and large sizes, are necessary.

SUMMARY OF THE INVENTION

The present invention provides a display apparatus including a wiring structure that is repairable and a method of repairing the display apparatus.

According to an aspect of the present invention, there is provided a display apparatus including: a plurality of unit pixels, each including a plurality of sub-pixels; a first line extending generally in a first direction from a common line as numbering many as the number of sub-pixels in each of the unit pixels so as to connect sub-pixels emitting light of the same color in neighboring unit pixels to each other; a second line extending generally in a second direction that crosses the first direction and connected to the sub-pixels; and a third line generally adjacent to the second line, extending in the second direction, and including a hole disposed near where the first line and the third line cross each other, and connected to the sub-pixels.

The third line may have a width that is greater than a width of the second line.

The third line may supply an electric power to the sub-pixels.

The hole may be adjacent to the second line.

The display apparatus may further include a fourth line extending generally in the first direction to be connected to the third line, and continuously disposed between the first lines connected to the sub-pixels of the unit pixel.

The fourth line may be a line for supplying electric power to the sub-pixels.

The sub-pixels may be configured to emit light of the same color in the first direction, and emit light of different colors in the second direction.

Each of the sub-pixels may include a first electrode, a second electrode, and an organic emission layer disposed between the first electrode and the second electrode.

The first electrode may be a transparent electrode, and the second electrode may be a reflective electrode.

According to another aspect of the present invention, there is provided a display apparatus including: a plurality of pixels; a first line extending generally in a first direction to be connected to the pixels; a second line extending generally in a second direction that crosses the first line to be connected to the pixels; and a third line extending generally in the second direction to be adjacent to the second line, and including a hole disposed approximately where the first line and the third line cross each other, and connected to the pixels.

According to another aspect of the present invention, there is provided a method of repairing a display apparatus that includes: a plurality of unit pixels, each including a plurality of sub-pixels; a first line extending generally in a first direction from a common line numbering as many as the number of sub-pixels in each of the unit pixels so as to connect sub-pixels emitting light of the same color in neighboring unit pixels to each other; a second line extending generally in a second direction that crosses the first direction and connected to the sub-pixels; and a third line adjacent to the second line, extending generally in the second direction, and including a hole disposed approximately where the first line and the third line cross each other, and connected to the sub-pixels, the method including: detecting a short-circuited portion of the first line and the second line; forming a repair pattern of an island shape by using the hole in the third line; disconnecting the short-circuited portion from the second line; and forming a bypass path by connecting the repair pattern and the second line to each other.

The forming of the repair pattern may include cutting a periphery of the hole in the third line to form the repair pattern adjacent to the second line.

The periphery of the hole may be cut by a laser beam, and the repair pattern and the disconnected second line may be connected to each other by using a chemical vapor deposition (CVD) method.

According to another aspect of the present invention, there is provided a method of repairing a display apparatus that includes: a first line extending generally in a first direction; a second line extending generally in a second direction that crosses the first line; and a third line extending generally in the second direction to be adjacent to the second line, and including a hole disposed approximately where the first line and the third line cross each other, the method including: detecting a short-circuited portion of the first line and the second line; forming a repair pattern of an island shape by using the hole in the third line; disconnecting the short-circuited portion from the second line; and forming a bypass path by connecting the repair pattern and the second line to each other.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to accompanying drawings.

Figure 1:
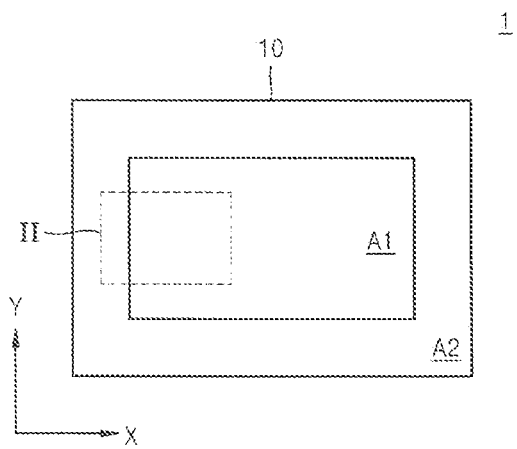
FIG. 1 is a schematic plan view of a display apparatus according to an embodiment of the present invention.
Figure 2:
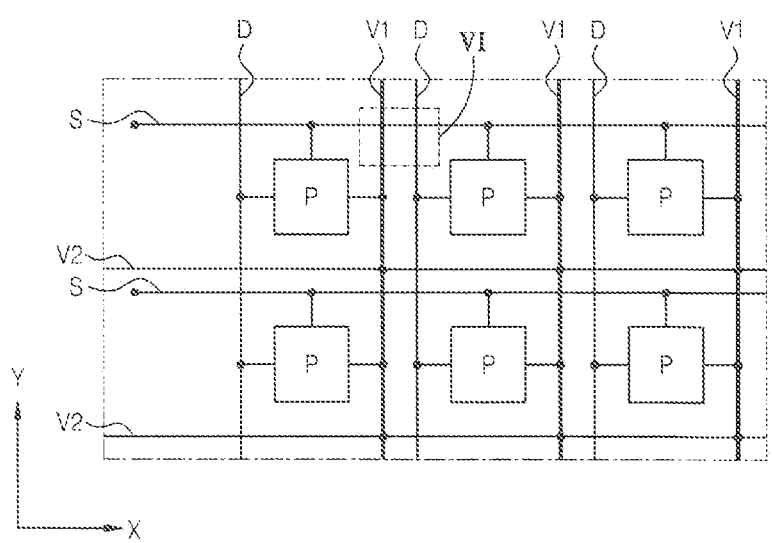
FIG. 2 is a schematic diagram showing a wiring structure in a portion II of FIG. 1.

FIG. 1 is a schematic plan view of a display apparatus 1 according to an embodiment of the present invention, and FIG. 2 is a schematic diagram of a wiring structure in a portion II of FIG. 1.

Hereinafter, it is assumed that the display apparatus 1 according to the embodiment of the present invention is an organic light emitting display apparatus. However, embodiments of the present invention are not limited to the organic light emitting display apparatus, and may be applied to various display apparatuses including inorganic light emitting display apparatuses, liquid crystal display apparatuses, and the like.

Referring to FIG. 1, the display apparatus 1 according to the present embodiment includes a substrate 10 on which a display area A1 and a non-display area A2 are defined.

The display area A1 is an area for display images, and is formed on a region including a center of the substrate 10. The non-display area A2 may be disposed on a peripheral portion of the display area A1.

The display area A1 includes a plurality of pixels P for realizing images.

Each of the pixels P may be defined by a scan line S extending in a first direction (X) and a data line D extending in a second direction (Y) that is generally perpendicular to the first direction X. The data line D applies a data signal provided by a data driving unit (not shown) disposed on the non-display area A2 to each of pixels P, and the scan line S applies a scan signal provided by a scan driving unit (not shown) disposed on the non-display area A2 to each of the pixels P. In FIG. 2, the data line D extends in the second direction Y and the scan line S extends in the first direction X; however, the present invention is not limited thereto. That is, the directions in which the data line D and the scan line S extend may be changed.

Each of the pixels P is connected to a first power supply line V1 extending in a second direction Y. The first power supply line V1 is adjacent to the data line D. The first power supply line V1 applies a first power source (ELVDD, refer to FIG. 3) provided by a first power driving unit (not shown) disposed on the non-display area A2 to each of the pixels P. Although not shown in FIG. 2, each of the pixels P receives a second power (ELVSS, refer to FIG. 3). Each pixel P controls an amount of current supplied from the first power source ELVDD to the second power source ELVSS via an organic light emitting diode (OLED, refer to FIG. 3) in response to the data signal. Then, the OLED generates light of a predetermined illuminance.

The first power supply line V1 is a wire for supplying the first power ELVDD to the pixel P, and thus, a voltage drop (IR drop) has to be small in order to maintain uniform image quality. Therefore, a line width of the first power supply line V1 is greater than a line width of the data line D. Then, a difference between the electric power generated due to a difference between lengths of lines to the pixels P adjacent to the first power driving unit (not shown) and to the pixels P far from the first power driving unit may be reduced, and accordingly, the entire display area A1 may have uniform image quality.

Meanwhile, second power supply lines V2 generally extending in the first direction X are connected to the first power supply lines V1. The second power supply lines V2 is a wire for supplying the first power ELVDD. For example, the first power supply lines V1 and the second power supply lines V2 may be connected to each other in a mesh type. The second power supply lines V2 may compensate the voltage drop according to the length caused by a resistor of the first power supply line V1.

Figure 3:
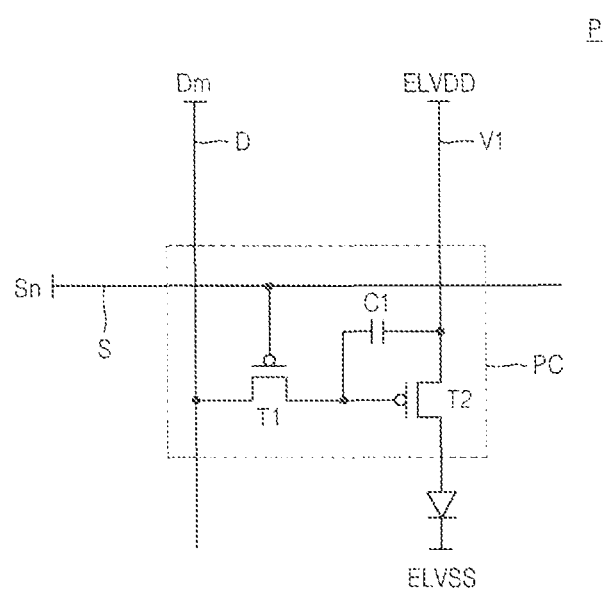
FIG. 3 is a circuit diagram schematically showing pixels shown in FIG. 2.

FIG. 3 is a circuit diagram of one pixel P shown in FIG. 2.

Referring to FIG. 3, the pixel P includes an OLED and a pixel circuit PC for supplying an electric current to the OLED.

A pixel electrode of the OLED is connected to the pixel circuit PC, and an opposite electrode of the OLED is connected to the second power ELVSS. The OLED generates light of a predetermined illuminance in response to the electric current supplied from the pixel circuit PC.

An active matrix type organic light emitting display apparatus includes at least two TFTs and at least one capacitor, in particular, a switching TFT for transmitting the data signal, a driving TFT for driving the OLED according to the data signal, and a capacitor for maintaining a data voltage.

A gate electrode of a first transistor TR1 is connected to the scan line S (refer to FIG. 2), a first electrode of the first transistor TR1 is connected to the data line D (refer to FIG. 2), and a second electrode of the first transistor TR1 is connected to a first node N1. That is, a scan signal Sn is input to the gate electrode of the first transistor TR1, and a data signal Dm is input to the first electrode of the first transistor TR1.

A gate electrode of a second transistor TR2 is connected to the first node N1, a first electrode of the second transistor TR2 is connected to the first power source ELVDD, and a second electrode of the second transistor TR2 is connected to a pixel electrode of the OLED. Here, the second transistor TR2 functions as a driving TFT.

A first capacitor C1 is connected between the first node N1 and the first electrode of the second transistor TR2, that is, the first power source ELVDD.

Figure 4:
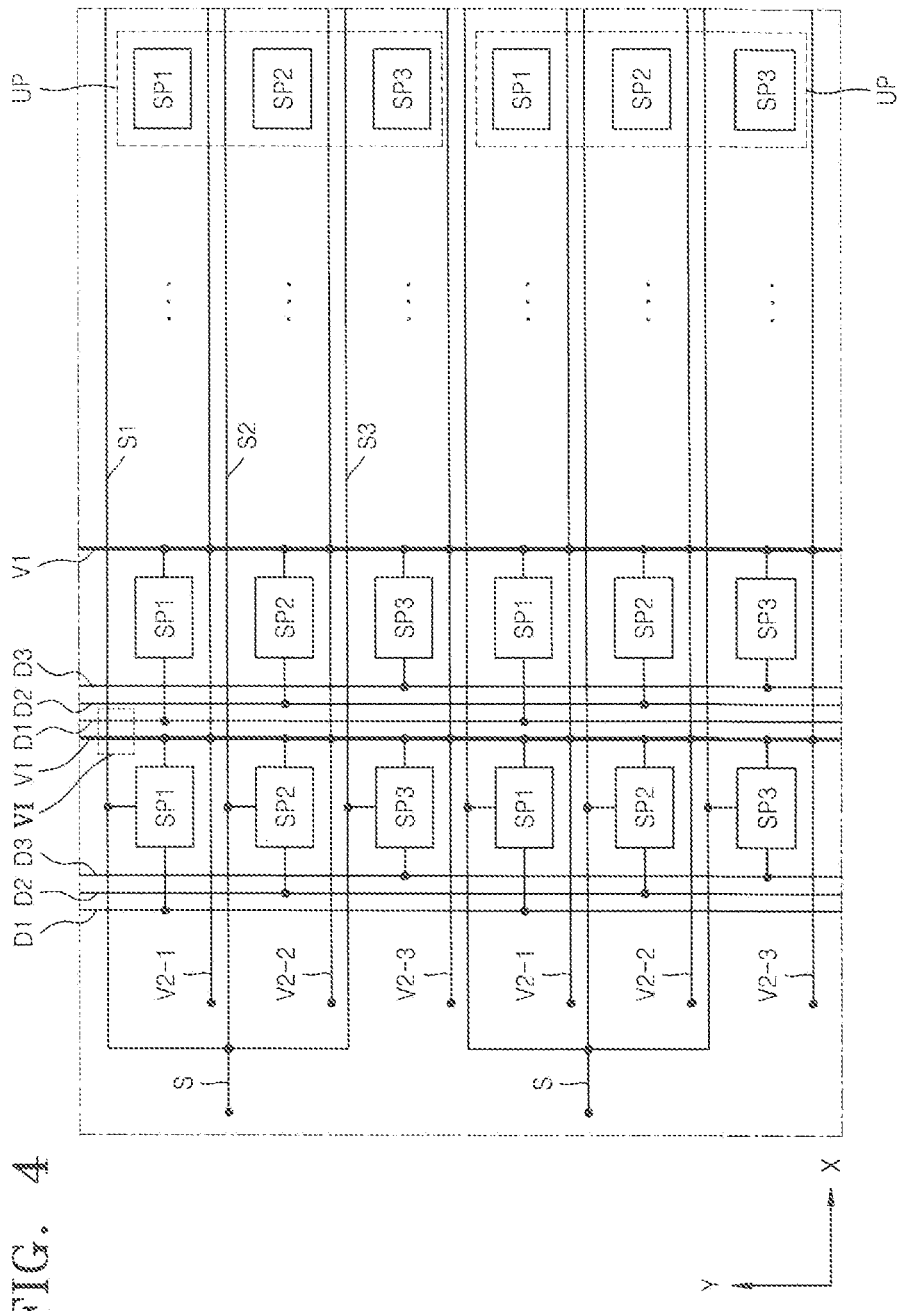
FIG. 4 is a schematic diagram showing another wiring structure in the portion II of FIG. 1.

FIG. 4 is a schematic diagram showing a wiring structure in the portion II of FIG. 1, according to another embodiment of the present invention.

The display area A1 includes a plurality of unit pixels UP realizing images.

Each of the unit pixels UP includes a plurality of sub-pixels SP1, SP2, and SP3 emitting light of different colors. For example, each of the unit pixels UP may include a sub-pixel emitting red light, a sub-pixel emitting green light, and a sub-pixel emitting blue light. In the present embodiment, three sub-pixels SP1, SP2, and SP3 configure a unit pixel UP; however, the present invention is not limited thereto. That is, the number of sub-pixels configuring the unit pixel UP may be increased or reduced, provided that the light emitted from the plurality of sub-pixels is mixed to generate white light or light of a certain color. For example, the sub-pixels may further include a sub-pixel emitting white light, in addition to the sub-pixels emitting the red, green, and blue light.

Sub-pixels SP1 emitting the same color light are arranged in the first direction X on the display area A1. The sub-pixels SP1, SP2, and SP3 emitting light of different colors are repeatedly arranged in the second direction Y that is perpendicular to the first direction X, and the sub-pixels SP1, SP2, and SP3 emitting the light of different colors configure a unit pixel UP.

In each of the unit pixels UP, first through third scan lines S1, S2, and S3 branched from one scan line S are arranged while generally extending in the first direction X. The first scan line S1 is connected to the sub-pixels SP1 emitting light of a first color in the neighboring unit pixels UP, the second scan line S2 is connected to the sub-pixels SP2 emitting light of a second color in the neighboring unit pixels UP, and the third scan line S3 is connected to the sub-pixels SP3 emitting light of a third color in the neighboring unit pixels UP. The sub-pixels SP1, SP2, and SP3 configuring one unit pixel UP are connected to different scan lines S1, S2, and S3, respectively. However, since the first through third scan lines S1 through S3 are branched from one scan line S, the scan signals input into the unit pixels UP are equal to each other.

First through third data lines D1, D2, and D3 that generally extend in the second direction Y to be separately connected to the sub-pixels SP1, SP2, and SP3 emitting the light of different colors from each other are disposed each of the unit pixels UP. That is, the first data line D1 is connected to the sub-pixel SP1 emitting the light of first color, the second data line D2 is connected to the sub-pixel emitting the light of the second color, and the third data line D3 is connected to the sub-pixel SP3 emitting the light of the third color. Therefore, data signals that are different from each other may be input to the sub-pixels SP1, SP2, and SP3 included in the each unit pixel UP.

In the present embodiment, the first through third data lines D1 through D3 are shorter than the first through third scan lines S1 through S3. When the lengths of the first through third data lines D1 through D3 are increased, intensities of the data signals input to the sub-pixels are reduced due to the line resistance according to the lengths. In general, the organic light emitting display apparatus is more sensitive to the data signal than to the scan signal. Therefore, unbalance between the data signals input to the organic light emitting display apparatus may be prevented, according to the present embodiment.

The first power supply line V1 for applying the first electric power ELVDD extends in the second direction Y to be connected to each of the sub-pixels SP1, SP2, and SP3 on the display area A1. The first power supply line V1 is adjacent to the data line D. Since the first power supply line V1 is the line for supplying the first electric power ELVDD to each of the sub-pixels SP1 through SP3, the voltage drop (IR drop) has to be small in order to maintain uniform image quality. Therefore, the first power supply line V1 has a line width that is greater than that of the data line D.

Meanwhile, in order to prevent the voltage dropping in the first power supply line V1, an additional power supply line may be further connected to each of the sub-pixels SP1 through SP3. In the present embodiment, second power supply lines V2-1, V2-2, and V2-3 connected to the first power supply line V1 and generally extending in the first direction X are further connected respectively to the sub-pixels SP1 through SP3 included in one unit pixel UP.

The second power supply lines V2-1, V2-2, and V2-3 may be successively arranged between the scan lines S1, S2, and S3 connected to the sub-pixels SP1, SP2, and SP3 of one unit pixel UP. In the present embodiment, the second power supply lines V2-1, V2-2, and V2-3 are connected to all the sub-pixels SP1, SP2, and SP3 included in each unit pixel UP. However, the present invention is not limited thereto, that is, at least two second power supply lines V2-1 and V2-2 may be successively arranged between the scan lines S1, S2, and S3 connected to the sub-pixels SP1, SP2, and SP3 of the unit pixel UP.

Figure 5:
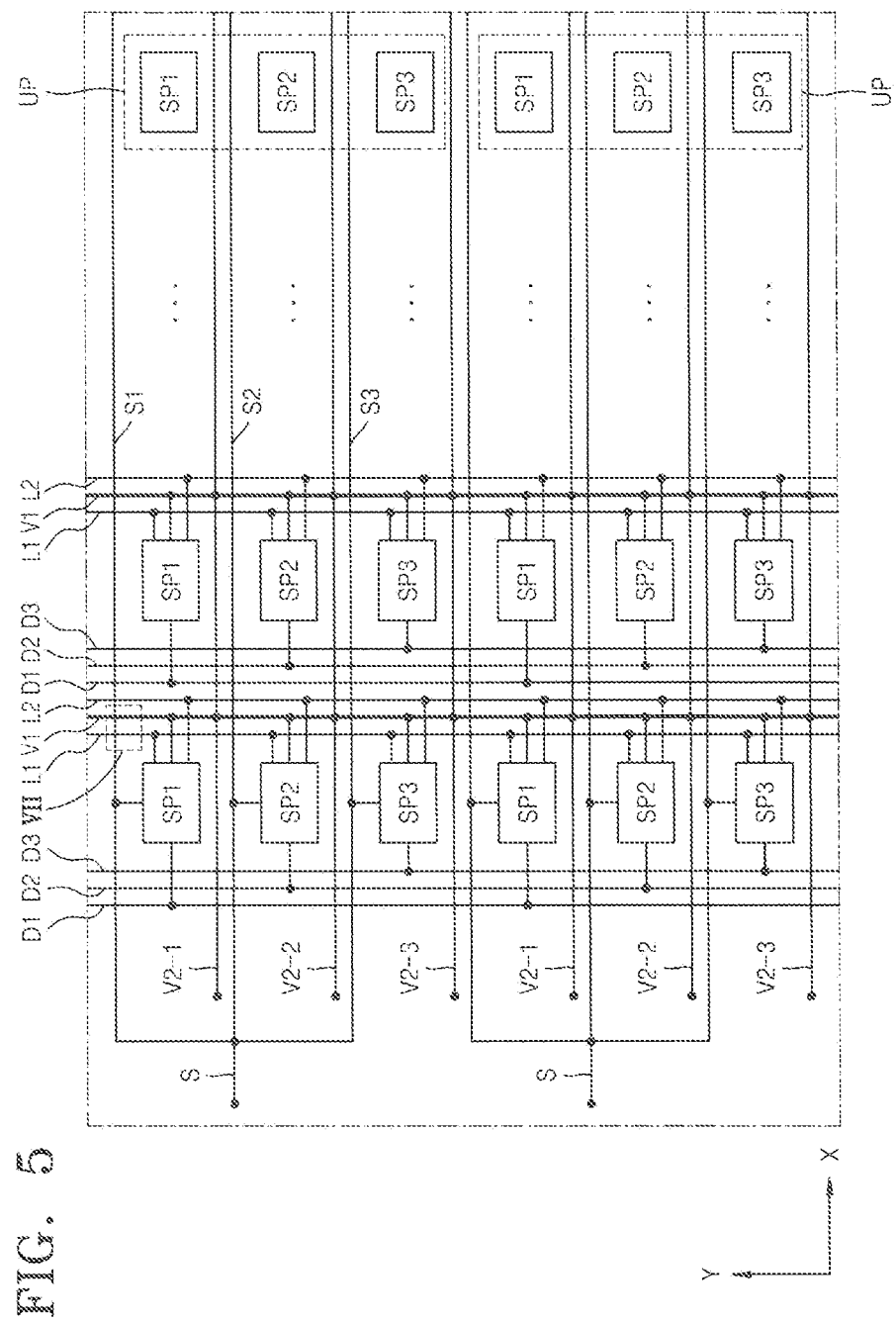
FIG. 5 is a schematic diagram showing another wiring structure in the portion II of FIG. 1.

FIG. 5 is a schematic diagram showing another example of the wiring structure in the portion II of FIG. 1.

The wiring structure shown in FIG. 5 further includes additional lines L1 and L2 that are adjacent to opposite sides of the first power supply line V1 and extend in the second direction Y, when compared with the structure of FIG. 4. Other components denoted by the same reference numerals as those of FIG. 4 have the same functions and operations as those of FIG. 4, and descriptions are not provided here.

A first signal line L1 and a second signal line L2 are lines for supplying a signal to each of the sub-pixels SP, and extend in the second direction Y. The first and second signal lines L1 and L2 are disposed to be generally adjacent to the first power supply line V1. The first signal line L1 is disposed at a side of the first power supply line V1, and the second signal line L2 is disposed at the other side of the first power supply line V1. Also, the display apparatus 1 may have both of the first and second signal lines L1 and L2 as shown in FIG. 5; however, the display apparatus 1 may include any one of the first and second signal lines L1 and L2. Since the first and second signal lines L1 and L2 are lines for transferring the signal, the first power supply line V1 generally has a width wider than those of the first and second signal lines L1 and L2.

The first signal line L1 or the second signal line L2 may be a compensation control signal line GC that compensates for a threshold voltage of the TFT included in each of the sub-pixels SP. That is, when the signal is applied by the compensation control signal line GC, the TFT included in each of the sub-pixels SP is turned on, and the driving TFT is diode connected to compensate for the threshold voltage of the driving TFT. As such, if the compensation control signal line GC is additionally formed, each of the sub-pixels SP may include an additional TFT, in which the compensation control signal line GC is connected to the pixel circuit shown in FIG. 3.

Meanwhile, the first signal line L1 or the second signal line L2 may be a common initialization control line GI that simultaneously initializes the capacitors included in the sub-pixels SP. That is, when a signal is applied from the common initialization control line GI, the TFT included in each of the sub-pixels SP is turned on to apply an initialization voltage to the capacitor connected to the TFT. As described above, in a case where the common initialization control line GI is additionally formed, each of the sub-pixels SP may further include an additional TFT, in which the common initialization control line GI is connected to the pixel circuit shown in FIG. 3, and a capacitor formed between the additional TFT and the first power supply line V1.

Otherwise, the first signal line L1 or the second signal line L2 may be a data input control line GW that allows the data signals to be transmitted simultaneously to the sub-pixels SP. That is, when the signal is applied from the data input control line GW, the TFT included in each of the sub-pixels SP is turned on, and thus, the driving TFT is diode-connected to compensate for the threshold voltage of the driving TFT. As such, when the data input control line GW is additionally formed, each of the sub-pixels SP may further include an additional TFT, in which the data input control line GW is connected to the pixel circuit shown in FIG. 3.

In addition to the above described signals, the first or second signal line L1 and L2 may transmit various kinds of signals, which vary depending on the number of the TFTs and the capacitors included in the sub-pixel, the connection type, and the driving type. Therefore, kinds and contents of the signals transmitted through the first and second signal lines L1 and L2 are not limited to the above examples.

FIGS. 4 and 5 show the wires briefly in order to describe complicated relations between the wires according to the embodiment of the present invention. In FIGS. 4 and 5, wires crossing each other with dots (•) are electrically connected to each other, and wires crossing each other without dots (•) are not electrically connected to each other. For example, the first power supply line V1 is electrically connected to the second power supply lines V2-1, V2-2, and V2-3 in each of the sub-pixels SP1, SP2, and SP3.

In addition, according to the wiring structures of FIGS. 4 and 5, the wires extending in the second direction Y are disposed by bunches. The above arrangement is essential for ensuring an aperture if the display apparatus 1 is a bottom emission type display apparatus, in which light is emitted toward the substrate 10. However, in the above structure, if defects such as short-circuit or opening in the first and second signal lines L1 and L2, and the data lines D occur, it is difficult to ensure a space for performing repairing operation because the lines are close to each other. For example, if a short-circuit has occurred, it is difficult to ensure a space for cutting the defected part and forming a bypass of the signal. Also, if an opening defect has occurred, a separation distance from an adjacent line is not ensured, and thus, there is a possibility of generating another short-circuit between the lines at the same level when the opened portions are connected. As described above, if there is a defect between the close lines, it is difficult to perform the repairing.

However, according to the embodiment of the present invention, a repair hole RH is formed in the first power supply line V1 having the wider line width than those of other lines, and thus, the defects occurring in the close lines can be repaired. Also, according to the embodiment of the present invention, since the repair hole RH is formed in the first power supply line V1, the defects of the adjacent lines may be easily repaired. Thus, production yield may be improved.

Figure 6:
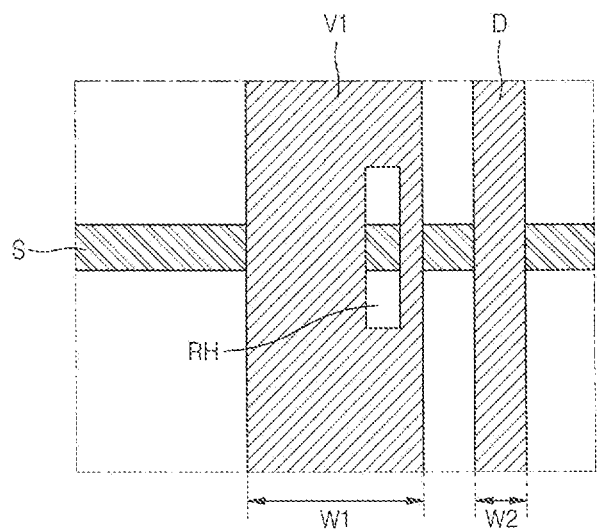
FIG. 6 is an enlarged view of a portion VI shown in FIGS. 2 and 4.
Figure 7:
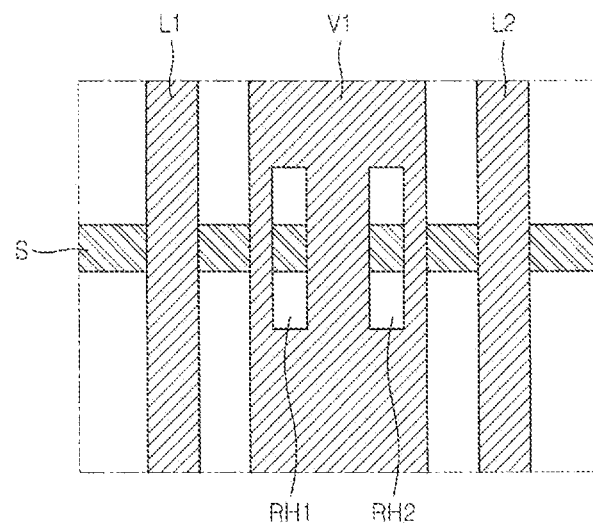
FIG. 7 is an enlarged view of a portion VII shown in FIG. 5.

FIG. 6 is an enlarged view of a portion VI shown in FIGS. 1 and 4, and FIG. 7 is an enlarged view of a portion VII of FIG. 5.

Referring to FIG. 6, the first power supply line V1 of the present embodiment includes the repair hole RH on or near a portion where the first power supply line V1 and the scan line cross each other. As described above, the first power supply line V1 has a generally greater line width than that of the data line D. Meanwhile, the repair hole RH is close to the data line D, because when the defect occurs on a portion where the data line D overlaps with the scan line S, the defect may be easily repaired through the repair hole RH.

Referring to FIG. 7, the first power supply line V1 includes a plurality of repair holes RH on or near a portion where the first power supply line V1 crosses the scan line S. Here, a first repair hole RH1 is generally adjacent to the first signal line L1, and a second repair hole RH2 is generally adjacent to the second signal line L2. As such, the first repair hole RH1 is used to repair the defect of the first signal line L1, and the second repair hole RH2 is used to repair the defect of the second signal line L2.

Since the first power supply line V1 has a sufficiently wide line width, the line resistance is not greatly increased even when the holes are formed in some parts thereof. Also, the first power supply line V1 of the present embodiment further includes the second power supply lines V2-1, V2-2, and V2-3 in order to prevent a voltage dropping problem caused by the line resistor. Therefore, the repair holes RH do not affect the voltage dropping.

Figure 8:
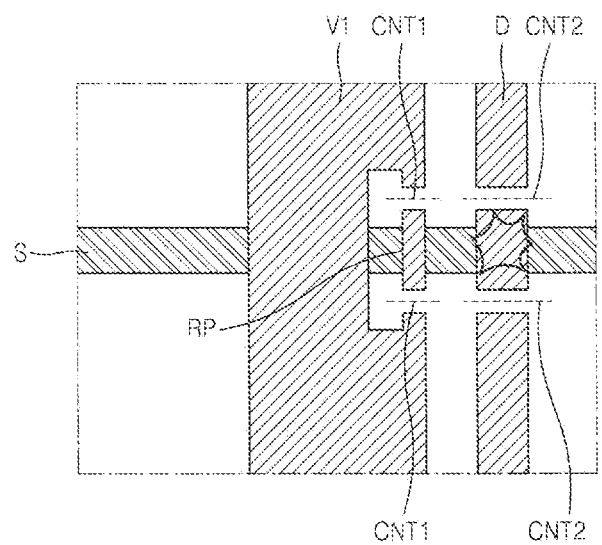
FIGS. 8 and 9 are diagrams illustrating a method of repairing FIG. 6.
Figure 9:
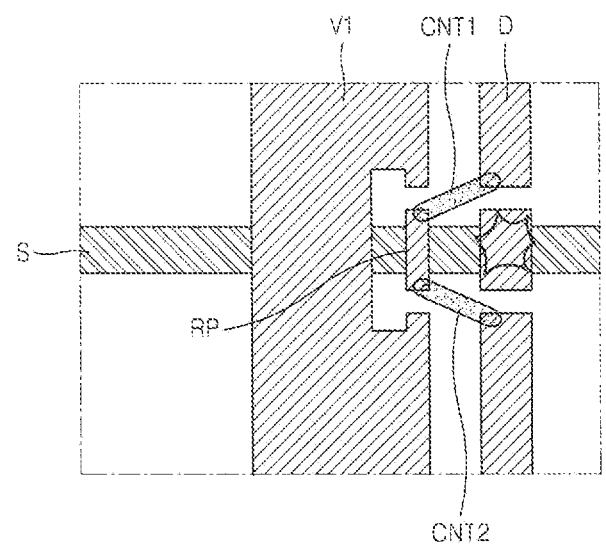

FIGS. 8 and 9 are diagrams illustrating a method of repairing the structure of FIG. 6. Although FIGS. 8 and 9 exemplary illustrate the method of repairing the wire structure shown in FIG. 6, the method of repairing the structure shown in FIG. 7 is basically the same as the method of repairing the structure of FIG. 6, except for that the number of repairing operations has increased. Therefore, the descriptions about the method of repairing the wire structure shown in FIG. 7 are not provided here.

FIGS. 8 and 9 show a case where the short-circuit defect occurs on a portion where the data line D and the scan line S overlap each other. The short-circuit defects are easily generated between the lines disposed on different layers due to impurities such as particles. In FIGS. 8 and 9, a case where the short-circuit defect is generated on a portion wherein the data line D and the scan line S overlap each other; however, the present invention is not limited thereto. That is, if the short-circuit defect is generated on a portion where the first signal line L1 and the scan line S overlap each other and a portion where the second signal line L2 and the scan line S overlap each other, the repairing method of the present embodiment may be performed.

Before performing the repairing of the short-circuit defect, a location where the short-circuit defect occurs is detected. The short-circuit defect may be detected by a method of detecting the defect by naked eyes or a monitor, and a method of detecting the defect location by applying voltages sequentially to the lines and monitoring a potential difference by using a power feed member and a power receiving member.

Referring to FIG. 8, a repair pattern is formed by using the repair hole RH in the first power supply line V1. In addition, the portion where the short-circuit defect occurs is disconnected from the data line D.

In more detail, periphery of the repair hole RH of the first power supply line V1 is cut to form a side of the repair hole RH, which is adjacent to the wire to be repaired, as a repair pattern RP of an island type. Here, the repair pattern RP is formed by irradiating a laser beam to a first cutting line CUT1. Meanwhile, the data line D is disconnected by irradiating a laser beam to a second cutting line CUT2 to remove the defected portion.

Referring to FIG. 9, the repair pattern RP and the disconnected data line D are connected to each other to form a bypass path, in order to perform the repair operation. In more detail, the repair pattern RP and the data line D are electrically connected to each other by using a chemical vapour deposition (CVD) apparatus. The CVD apparatus irradiates the laser beam to a surface of the substrate 10 and injects a raw material gas, after disposing the substrate 10 in a vacuum chamber. In the CVD process, the laser beam induces photolysis of the raw material gas to form a first metal pattern CNT1 and a second metal pattern CNT2 on the portion where the laser beam is irradiated. The CVD apparatus may form the first and second metal patterns CNT1 and CNT2 by using metal such as chrome (Cr), tungsten (W), and molybdenum (Mo). The first metal pattern CNT1 is disposed on a third insulating layer (18 of FIG. 10) so that a side of the disconnected portion of the data line D and a side of the repair pattern RP overlap each other. The second metal pattern CNT2 is disposed on the third insulating layer 19 (refer to FIG. 10) so that the other side of the disconnected portion of the data line D and the other side of the repair pattern RP overlap each other. Next, the laser beam is irradiated to the portion where the metal patterns CNT1 and CNT2 and the data line D overlap each other, and the portion where the metal patterns CNT1 and CNT2 and the repair pattern RP overlap each other. Then, the metal patterns CNT1 and CNT2 penetrate through the third insulating layer 18 (refer to FIG. 10) to be connected to the data line D and connected to the repair pattern RP through a laser welding operation. Therefore, the disconnected portion of the data line D is connected to the metal patterns CNT1 and CNT2 via the repair pattern RP.

According to the embodiment of the present invention, the repairing of the adjacent lines may be performed due to the repair hole RP formed in the first power supply line V1.

Although not shown in FIGS. 8 and 9, in a case where an open defect of the data line D occurs on a location where the data line D and the scan line S overlap each other, the short-circuit defect may occur between adjacent lines at the same level during connecting the opened data lines D to each other by using the CVD apparatus due to lack of the repairing space. However, according to the embodiment of the present invention, if the short-circuit defect occurs between the repaired data line D and the first power supply line V1, the short-circuited portion may be easily separated from the first power supply line V1 by using the repair hole RH of the first power supply line V1, and thus, the above problem can be addressed.

Figure 10:
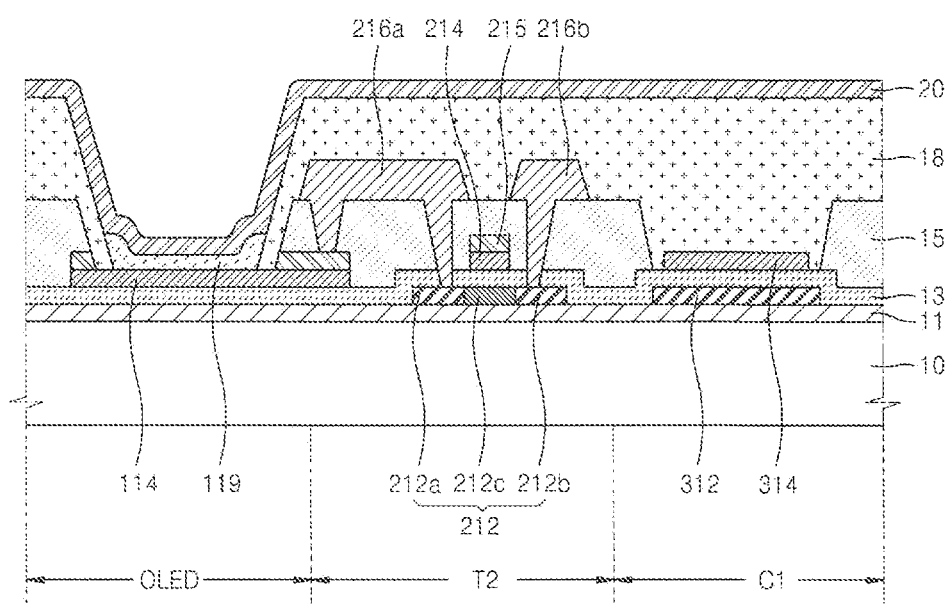
FIG. 10 is a schematic cross-sectional view of partial elements of pixels in the display apparatus according to the embodiment of the present invention.

FIG. 10 is a schematic cross-sectional view of a pixel included in an organic light emitting display apparatus 1 according to an embodiment of the present invention.

Referring to FIG. 10, a second transistor T2 that is a driving TFT, a capacitor C1, and an organic light emitting diode (OLED) are disposed on the substrate 10. As described above, sub-pixels further include additional TFTs and capacitors, and various lines. However, FIG. 10 shows some of the components for convenience of description.

The substrate 10 may be formed of a transparent glass material mainly including $SiO_2$; however, the present invention is not limited thereto, that is, the substrate 10 may be formed of a transparent plastic material.

A buffer layer 11 may further formed on the substrate 10. The buffer layer 11 provides a flat surface on the substrate 10, and prevents moisture and impurities from infiltrating in the substrate 10.

An active layer 212 of a second transistor T2 is formed on the buffer layer 11. The active layer 212 may be formed of inorganic semiconductor such as amorphous silicon or polysilicon. Also, the active layer 212 may be formed of organic semiconductor, oxide semiconductor, or other various materials. The active layer 212 includes a source region 212b, a drain region 212a, and a channel region 212c.

A gate electrode first layer 214 and a gate electrode second layer 215 including a transparent conductive material are sequentially formed on the active layer 212 on a location corresponding to the channel region 212c of the active layer 212 as interposing the first insulating layer 13 that is a gate insulating layer between the active layer and the gate electrode first layer 214.

A source electrode 216b and a drain electrode 216a that are respectively connected to the source region 212b and the drain region 212a of the active layer 212 are formed on the gate electrode second layer 215 as interposing the second insulating layer 15 that is an interlayer dielectric therebetween.

A third insulating layer 18 for covering the source electrode 216b and the drain electrode 216a is disposed on the second insulating layer 15. The third insulating layer 18 may be an organic insulating layer.

A pixel electrode first layer 114 formed of a transparent conductive material that is the same as the gate electrode first layer 214 is formed on the buffer layer 11 and the first insulating layer 13. The transparent conductive material may be at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

An emission layer 119 is formed on the pixel electrode first layer 114, and the light emitted from the emission layer is emitted toward the substrate 10 through the pixel electrode first layer 114 formed of the transparent conductive material.

The emission layer 119 may be formed of a low-molecular weight organic material or a high-molecular weight organic material. When a low-molecular weight organic material is used, the emission layer 105 may have multi-layer structure including at least one selected from the group consisting of a hole injection layer (HIL), a hole transport layer (HTL), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum ($Alq_3$), and the like.

On the other hand, when a high-molecular weight organic layer is used, the emission layer 119 may have a structure at least including a HTL. In this case, the HTL may be formed of poly-(3,4)-ethylene-dihydroxy thiophene (PEDOT) or polyaniline (PANI). Here, the high-molecular weight organic material that may be used is a polymer organic material such as polyphenylenevinylenes (PPVs) or polyfluorenes.

An opposite electrode 20 is disposed on the emission layer 119 as a common electrode. In the organic light emitting display apparatus according to the present embodiment, the pixel electrode first layer 114 may be used as an anode and the opposite electrode 20 may be used as a cathode. Alternatively, polarities of the pixel and opposite electrodes 114 and 20 may be opposite to the above example.

The opposite electrode 20 may be formed as a reflective electrode including a reflective material. Here, the opposite electrode 20 may include one or more materials selected from the group consisting of Al, Mg, Li, Ca, LiF/Ca, and LiF/Al.

Because the opposite electrode 20 is a reflective electrode, light emitted from the emission layer 119 is reflected by the opposite electrode 20 and then transmits through the pixel electrode first layer 114 formed of the transparent conductive material to be emitted toward the substrate 10.

Since the organic light emitting display apparatus 1 of the present embodiment is a bottom emission type display apparatus, in which the light is emitted toward the substrate 10, the pixel electrode first layer 114 may be formed so as not to overlap the scan lines S1, S2, and S3, the data line D1, D2, and D3, the first power supply line V1, and the second power supply lines V2-1, V2-2, and V2-3 (refer to FIG. 2).

A lower electrode 312 of the capacitor C1, which is formed of the same material as that of the active layer 212 of the TFT, an upper electrode 314 of the capacitor C1, which includes the transparent conductive material and formed of the same material as that of the pixel electrode first layer 114, and the first insulating layer 13 disposed between the lower electrode 312 and the upper electrode 314 are formed on the substrate 10 and the buffer layer 11.

Although the first insulating layer 13 is located on the lower electrode 312, the first insulating layer 13 is not disposed on outer portions of the upper electrode 314. The second insulating layer 15 is disposed on the first insulating layer 13, and the second insulating layer 15 exposes the entire upper electrode 314 of the capacitor C1 so that the entire upper electrode 314 may contact the third insulating layer 18.

Although not shown in FIG. 10, a sealing member (not shown) may be disposed on the opposite electrode 20 to as to face a surface of the substrate 10. The sealing member (not shown) is formed to protect the emission layer 119 against the external moisture or oxygen, and may be formed of glass or plastic to have a structure in which a plurality of organic and inorganic materials are stacked.

According to the display apparatus and the method of repairing the display apparatus, following effects can be obtained.

First, adjacent lines are repaired by using the hole formed in the line, and thus, there is no need to form an additional space for performing the repairing, and integration between the lines may be improved. In addition, even when gaps between the lines are very narrow, defects may be repaired easily. That is, defective lines may be easily repaired on the large-sized display apparatus, production yield may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus comprising:
   a plurality of unit pixels, each including a plurality of sub-pixels;
   one or more first lines, extending generally in a first direction from a common line, numbering as many as the number of sub-pixels in each of the unit pixels, connecting sub-pixels emitting light of the same color in neighboring unit pixels;
   a second line, extending generally in a second direction that crosses the first direction, connected to the sub-pixels; and
   a third line, adjacent to the second line, extending generally in the second direction, and including a hole disposed approximately where the first line and the third line cross each other, and the third line being connected to the sub-pixels.

2. The display apparatus of claim 1, wherein the third line has a width that is greater than the width of the second line.

3. The display apparatus of claim 1, wherein the third line supplies electric power to the sub-pixels.

4. The display apparatus of claim 1, wherein the hole is generally disposed adjacent to the second line.

5. The display apparatus of claim 1, further comprising a fourth line, extending in the first direction, connected to the third line, and generally disposed between the first lines connected to the sub-pixels of the unit pixel.

6. The display apparatus of claim 5, wherein the fourth line supplies electric power to the sub-pixels.

7. The display apparatus of claim 1, wherein the sub-pixels emit light of the same color generally in the first direction, and emit light of different colors generally in the second direction.

8. The display apparatus of claim 1, wherein each of the sub-pixels comprises a first electrode, a second electrode, and an organic emission layer disposed between the first electrode and the second electrode.

9. The display apparatus of claim 8, wherein the first electrode is a transparent electrode, and the second electrode is a reflective electrode.

10. A display apparatus comprising:
    a plurality of pixels;
    a first line, extending generally in a first direction, connected to the pixels;
    a second line, extending generally in a second direction that crosses the first line, connected to the pixels; and
    a third line, extending generally in the second direction generally adjacent to the second line, and including a hole disposed approximately where the first line and the third line cross each other, the third line being connected to the pixels.

11. The display apparatus of claim 10, wherein the third line has a width that is greater than the width of the second line.

12. The display apparatus of claim 10, wherein the third line supplies an electric power to the sub-pixels.

13. The display apparatus of claim 10, wherein the hole is disposed generally adjacent to the second line.

14. A method of repairing the display apparatus of claim 1 the method comprising:
    detecting a short-circuited portion of the first line and the second line;
    forming a repair pattern of an island shape by using the hole in the third line;
    disconnecting the short-circuited portion from the second line; and
    forming a bypass path by connecting the repair pattern and the second line to each other.

15. The method of claim 14, wherein the forming of the repair pattern comprises cutting a periphery of the hole in the third line to form the repair pattern adjacent to the second line.

16. The method of claim 15, wherein the periphery of the hole is cut by a laser beam, and the repair pattern and the disconnected second line are connected to each other by using a chemical vapor deposition (CVD) method.

17. A method of repairing the display apparatus of claim 10 the method comprising:
    detecting a short-circuited portion of the first line and the second line;
    forming a repair pattern of an island shape by using the hole in the third line;
    disconnecting the short-circuited portion from the second line; and
    forming a bypass path by connecting the repair pattern and the second line to each other.

18. The method of claim 17, wherein the forming of the repair pattern comprises cutting a periphery of the hole in the third line to form the repair pattern adjacent to the second line.

19. The method of claim 18, wherein the periphery of the hole is cut by a laser beam, and the repair pattern and the disconnected second line are connected to each other by using a chemical vapor deposition (CVD) method.

* * * * *